US010043861B2

(12) United States Patent
Zeng et al.

(10) Patent No.: US 10,043,861 B2
(45) Date of Patent: Aug. 7, 2018

(54) PACKAGE METHOD OF OLED SUBSTRATE AND OLED PACKAGE STRUCTURE

(71) Applicant: Shenzhen China Star Optoelectronics Technology Co., Ltd., Shenzhen (CN)

(72) Inventors: Weijing Zeng, Shenzhen (CN); Yuanjun Hsu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 186 days.

(21) Appl. No.: 15/106,817

(22) PCT Filed: Apr. 26, 2016

(86) PCT No.: PCT/CN2016/080280
§ 371 (c)(1),
(2) Date: Jun. 20, 2016

(87) PCT Pub. No.: WO2017/161628
PCT Pub. Date: Sep. 28, 2017

(65) Prior Publication Data
US 2018/0083082 A1    Mar. 22, 2018

(30) Foreign Application Priority Data

Mar. 23, 2016 (CN) .......................... 2016 1 0173097

(51) Int. Cl.
*H01L 27/14* (2006.01)
*H01L 27/32* (2006.01)
(Continued)

(52) U.S. Cl.
CPC ........ *H01L 27/3258* (2013.01); *H01L 51/524* (2013.01); *H01L 51/5259* (2013.01);
(Continued)

(58) Field of Classification Search
CPC .... H01L 51/524; H01L 51/5259; H01L 51/56
(Continued)

(56) References Cited

U.S. PATENT DOCUMENTS

| 9,299,749 B2* | 3/2016 | Han ...................... H01L 51/524 |
| 9,632,364 B2* | 4/2017 | Han ...................... G02F 1/1339 |
| 2007/0152217 A1* | 7/2007 | Lai ...................... H01L 27/1225 |
| | | 257/59 |

FOREIGN PATENT DOCUMENTS

| CN | 103000823 A | 3/2013 |
| CN | 104538566 A | 1/2015 |
| CN | 104538566 A | 4/2015 |

* cited by examiner

*Primary Examiner* — Tan N Tran
(74) *Attorney, Agent, or Firm* — Leong C. Lei

(57) ABSTRACT

The present invention provides a package method of an OLED substrate and an OLED package structure. In the package method, by manufacturing the passivation layer with two layers in the process of manufacturing the OLED substrate, and the first layer is a regular silicon oxide layer, and the second layer is a silicon oxynitride layer, and the silicon oxynitride layer directly contacts with the seal, and the adhesion of the seal and the silicon oxynitride layer is stronger to promote the adhesion result of the seal and the OLED substrate for achieving the result of raising the seal package performance. In the OLED package structure of the present invention, similarly, the property of stronger adhesion of the seal and the silicon oxynitride layer is utilized to promote the adhesion result of the seal and the OLED substrate for achieving the result of raising the seal package performance.

7 Claims, 6 Drawing Sheets

(51) Int. Cl.
*H01L 51/52* (2006.01)
*H01L 51/56* (2006.01)

(52) U.S. Cl.
CPC ........ *H01L 51/56* (2013.01); *H01L 2227/323* (2013.01); *H01L 2251/303* (2013.01); *H01L 2251/558* (2013.01)

(58) Field of Classification Search
USPC .............................................. 257/40, 59, 72
See application file for complete search history.

display region package region display region package region display region package region

PACKAGE METHOD OF OLED SUBSTRATE AND OLED PACKAGE STRUCTURE

FIELD OF THE INVENTION

The present invention relates to a display technology field, and more particularly to a package method of an OLED substrate and an OLED package structure.

BACKGROUND OF THE INVENTION

An OLED is an Organic Light Emitting Diodes Display possessing properties of self-illumination, high brightness, wide view angle, high contrast, flexibility and low power consumption, etc., and accordingly has been received more attentions. As being the display of next generation, it has been gradually replaced traditional LCD (Liquid Crystal Display) and widely applied in cellular phone screens, computer displays, full color TV, etc. Because the organic material easily reacts with the water and the vapor, little water vapor and oxygen can damage organic light emitting material and makes the light emitting performance of the element degraded. Therefore, how to reduce the permeation of the water vapor and the oxygen to the element package material and to erase the water vapor and the oxygen inside the element is the important issue to solve for the package skill of the organic electroluminescent device. For achieving the commercialization of the OLED display panel, the related package technology becomes the focus of the research.

The common package technologies at present are: ultraviolet (UV) solidification seal, glass powder laser sealing, face seal, seal, dam and fill and thin film package and etc. The organic seal will be utilized for the ultraviolet (UV) solidification seal, seal and dam and fill, and some new package technologies also will have usage of combination with the organic seal. Consequently, the organic seal package result is very important. The adhesion of the seal and the substrate surface is the important factor of determining the package result. Thus, in the manufacture process of the OLED substrate, the surface material of the seal coating region (i.e. package region) is significantly important.

FIG. 1 is a structure diagram of an OLED substrate according to prior art. The OLED substrate comprises a display region, and a package region at a periphery of the display region. As shown in FIG. 1, a structure of the OLED substrate in the display region comprises a substrate 100, a gate metal layer 200 located on the substrate 100, a gate isolation layer 300 located on the gate metal layer 200 and substrate 100, a semiconductor layer 400 located on the gate isolation layer 300, an etching stopper layer 500 located on the semiconductor layer 400 and the gate isolation layer 300, a source drain metal layer 600 located on the etching stopper layer 500, the semiconductor layer 400 and the gate isolation layer 300, a passivation layer 700 located on the source drain metal layer 600, the etching stopper layer 500 and the gate isolation layer 300, an anode 810 on the passivation layer 700, a pixel definition layer 820 located on the anode 810 and the passivation layer 700 and a light emitting layer 850 located on the pixel definition layer 820;

A structure of the OLED substrate in the package region comprises a substrate 100, a gate metal layer 200 located on the substrate 100, a gate isolation layer 300 located on the gate metal layer 200, an etching stopper layer 500 located on the gate isolation layer 300 and a source drain metal layer 600 located on the etching stopper layer 500 and a passivation layer 700 located on the source drain metal layer 600.

As shown in FIG. 1, the surface of the package region of the OLED substrate is the passivation layer 700, and material of the passivation layer 700 is silicon oxide ($SiO_x$) in general. According the present research result, the adhesion of the general organic seal and the silicon oxide interface is worse, which leads to the worse package result, and the water vapor and the oxygen can permeate into the internal package region through the gaps more easily. Accordingly, the performance of the OLED element degenerates faster, and the lifetime is shortened.

SUMMARY OF THE INVENTION

An objective of the present invention is to provide a package method of an OLED substrate, which can raise the adhesion of the seal and the OLED for substrate for achieving the result of the seal package performance.

Another objective of the present invention is to provide an OLED package structure, of which the adhesion of the seal and the OLED substrate is better, and the tightness is great to effectively diminish the oxygen and the water vapor permeating to the inside of the OLED. Accordingly, the performance of the OLED element is promoted and the usage lifetime of the OLED element is extended.

For realizing the aforesaid objectives, the present invention provides a package method of an OLED substrate, comprising steps of:

step 1, providing a TFT substrate, and the TFT substrate comprises a display region, and a package region at a periphery of the display region;

step 2, sequentially forming a silicon oxide layer and a silicon oxynitride layer on the display region and the package region of the TFT substrate;

step 3, sequentially manufacturing an anode, a pixel definition layer and a light emitting layer on the display region of the TFT substrate to obtain an OLED substrate;

step 4, providing a package cover plate, and coating seal on the package cover plate corresponding to a surface of the package region of the OLED substrate;

step 5, oppositely laminating the OLED substrate and the package cover plate;

step 6, solidifying the seal to accomplish package of the package cover plate to the OLED substrate.

A structure of the TFT substrate in the display region comprises a substrate, a gate metal layer located on the substrate, a gate isolation layer located on the gate metal layer and substrate, a semiconductor layer located on the gate isolation layer, an etching stopper layer located on the semiconductor layer and the gate isolation layer and a source drain metal layer located on the etching stopper layer, the semiconductor layer and the gate isolation layer;

a structure of the TFT substrate in the package region comprises a substrate, a gate metal layer located on the substrate, a gate isolation layer located on the gate metal layer, an etching stopper layer located on the gate isolation layer and a source drain metal layer located on the etching stopper layer.

In the step 2, both the silicon oxide layer and the silicon oxynitride layer are obtained by utilizing chemical vapor deposition, and a reaction formula of forming the silicon oxide layer by utilizing chemical vapor deposition is: $SiH_4 + N_2O \rightarrow SiO_x$; a reaction formula of forming the silicon oxynitride layer by utilizing chemical vapor deposition is: $SiH_4 + N_2O + N_2 \rightarrow SiO_xN_y$.

A thickness of the silicon oxide layer is 1500-4000 nm; a thickness of the silicon oxynitride layer is 0-500 nm.

The step 4 further comprises: forming a seal film on the package cover plate in a region inside the seal; the package cover plate is a glass substrate; material of the seal film is polymer containing dryer or polymer capable of blocking water and vapor; in the step 6, a method of ultraviolet light irradiation or heating is employed for solidifying the seal.

The present invention further provides an OLED package structure, comprising an OLED substrate, a package cover plate oppositely located to the OLED substrate and seal located between the OLED substrate and the package cover plate;

the OLED substrate comprises a display region and a package region at a periphery of the display region, and a surface layer of the package region of the OLED substrate is a silicon oxynitride layer, and the seal is located between the package region of the OLED substrate and the package cover plate to make the seal contact with the silicon oxynitride layer.

A structure of the OLED substrate in the display region comprises a substrate, a gate metal layer located on the substrate, a gate isolation layer located on the gate metal layer and substrate, a semiconductor layer located on the gate isolation layer, an etching stopper layer located on the semiconductor layer and the gate isolation layer, a source drain metal layer located on the etching stopper layer, the semiconductor layer and the gate isolation layer, a silicon oxide layer located on the source drain metal layer, the etching stopper layer and the gate isolation layer, a silicon oxynitride layer located on the silicon oxide layer, an anode on the silicon oxynitride layer, a pixel definition layer located on the anode and the silicon oxynitride layer and a light emitting layer located on the pixel definition layer;

a structure of the OLED substrate in the package region comprises a substrate, a gate metal layer located on the substrate, a gate isolation layer located on the gate metal layer, an etching stopper layer located on the gate isolation layer, a source drain metal layer located on the etching stopper layer, a silicon oxide layer located on the source drain metal layer and a silicon oxynitride layer located on the silicon oxide layer.

A thickness of the silicon oxide layer is 1500-4000 nm; a thickness of the silicon oxynitride layer is 0-500 nm.

The OLED substrate further comprises a seal film which is completely filled in an interior space between the OLED substrate and the package cover plate surrounded by seal.

The package cover plate is a glass substrate; material of the seal film is polymer containing dryer or polymer capable of blocking water and vapor.

The present invention further provides a package method of an OLED substrate, comprising steps of:

step 1, providing a TFT substrate, and the TFT substrate comprises a display region, and a package region at a periphery of the display region;

step 2, sequentially forming a silicon oxide layer and a silicon oxynitride layer on the display region and the package region of the TFT substrate;

step 3, sequentially manufacturing an anode, a pixel definition layer and a light emitting layer on the display region of the TFT substrate to obtain an OLED substrate;

step 4, providing a package cover plate, and coating seal on the package cover plate corresponding to a surface of the package region of the OLED substrate;

step 5, oppositely laminating the OLED substrate and the package cover plate;

step 6, solidifying the seal to accomplish package of the package cover plate to the OLED substrate;

wherein a structure of the TFT substrate in the display region comprises a substrate, a gate metal layer located on the substrate, a gate isolation layer located on the gate metal layer and substrate, a semiconductor layer located on the gate isolation layer, an etching stopper layer located on the semiconductor layer and the gate isolation layer and a source drain metal layer located on the etching stopper layer, the semiconductor layer and the gate isolation layer;

a structure of the TFT substrate in the package region comprises a substrate, a gate metal layer located on the substrate, a gate isolation layer located on the gate metal layer, an etching stopper layer located on the gate isolation layer and a source drain metal layer located on the etching stopper layer;

wherein in the step 2, both the silicon oxide layer and the silicon oxynitride layer are obtained by utilizing chemical vapor deposition, and a reaction formula of forming the silicon oxide layer by utilizing chemical vapor deposition is: $SiH_4+N_2O \rightarrow SiO_x^-$; a reaction formula of forming the silicon oxynitride layer by utilizing chemical vapor deposition is: $SiH_4+N_2O+N_2 \rightarrow SiO_xN_y$.

The benefits of the present invention are: the present invention provides the package method of the OLED substrate. By manufacturing the passivation layer with two layers in the process of manufacturing the OLED substrate, and one is a regular silicon oxide layer, and the other is a silicon oxynitride layer, in the package procedure, the silicon oxynitride layer directly contacts with the seal, and the adhesion of the seal and the silicon oxynitride layer is stronger to promote the adhesion result of the seal and the OLED substrate for achieving the result of the seal package performance. The present invention provides an OLED package structure. By arranging the surface layer of the package region of the OLED substrate to be the silicon oxynitride layer, the property of stronger adhesion of the seal and the silicon oxynitride layer is utilized to promote the adhesion result of the seal and the OLED substrate for achieving the result of the seal package performance.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
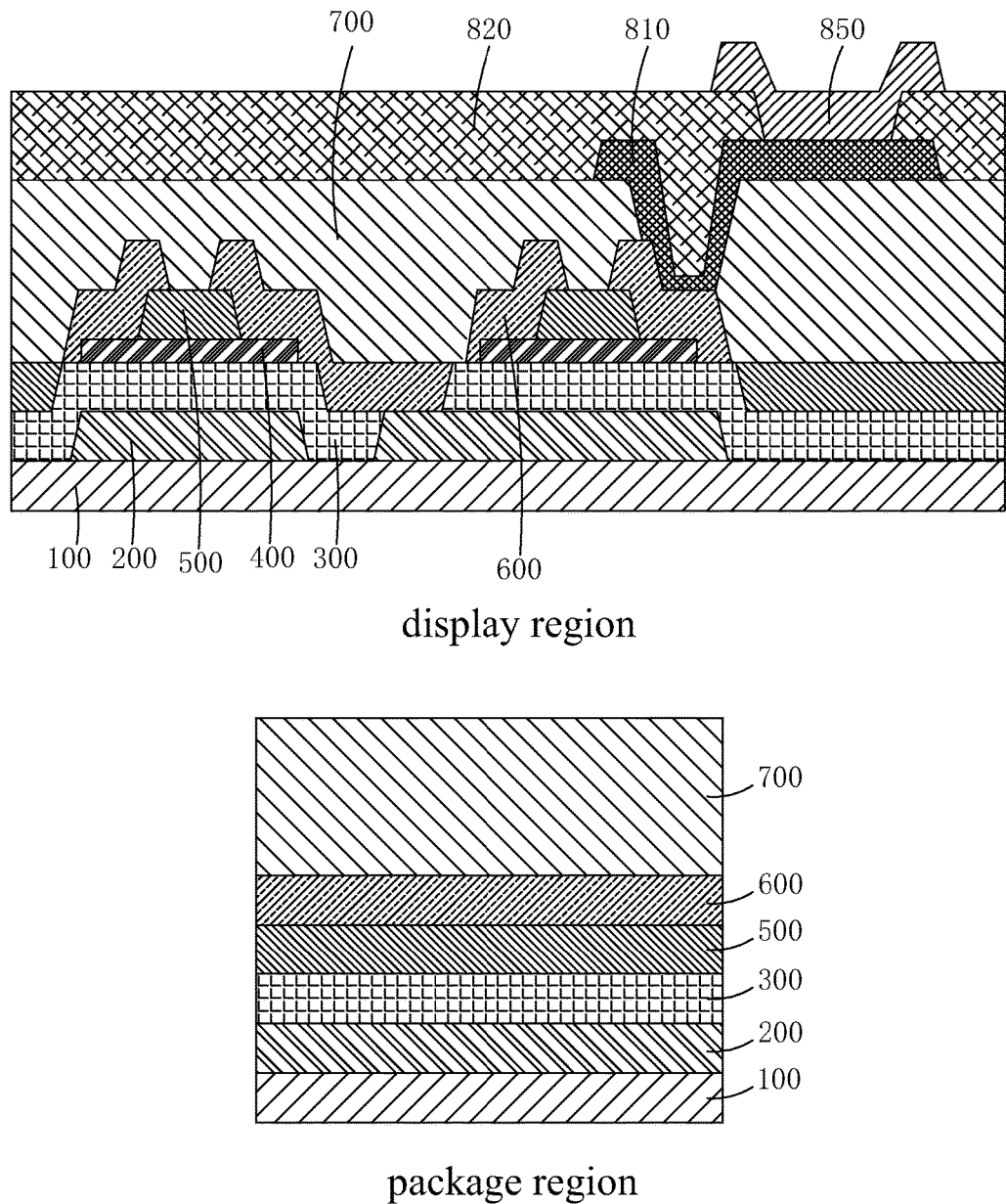
FIG. 1 is a structure diagram of an OLED substrate according to prior art.
Figure 2:
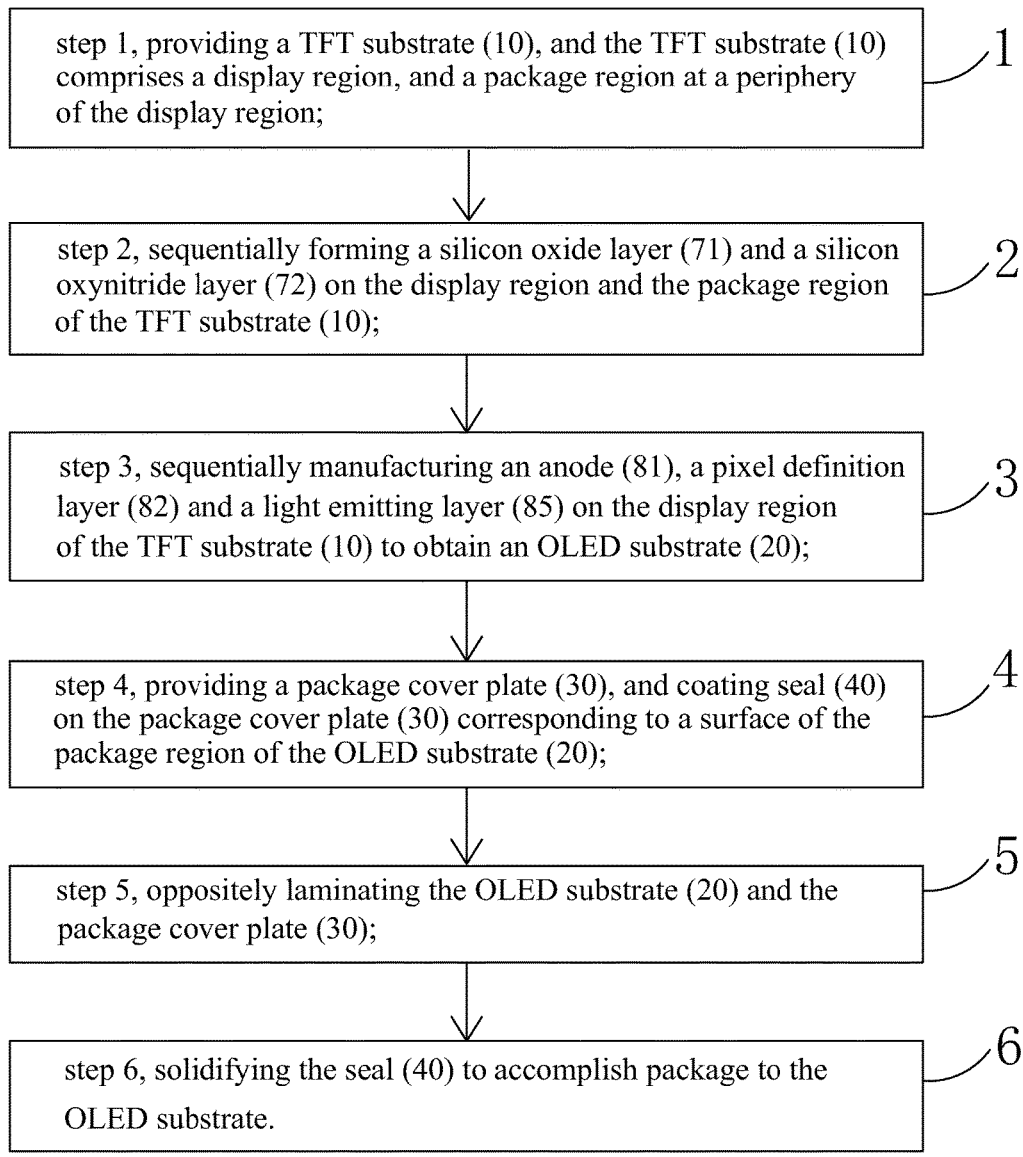
FIG. 2 is a flowchart of a package method of an OLED substrate according to the present invention.
Figure 3:
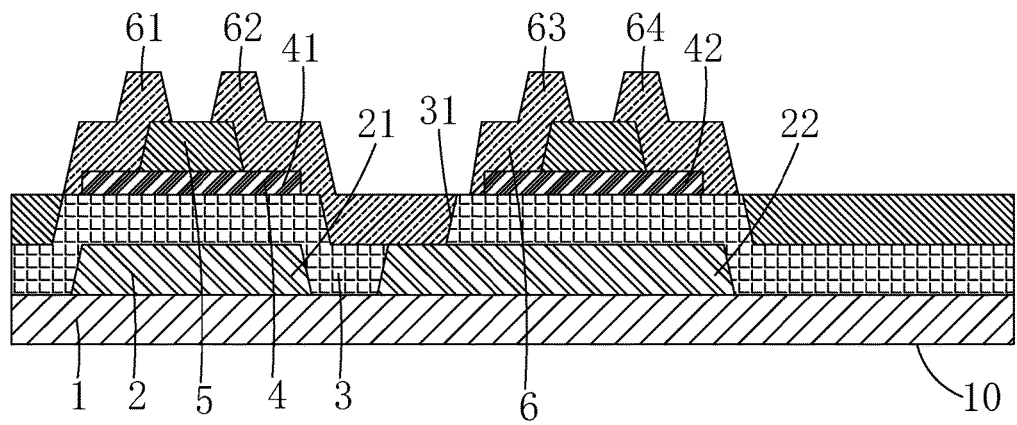
FIG. 3 is a structure diagram of a TFT substrate provided in the step 1 in the package method of the OLED substrate according to the present invention.
Figure 3:
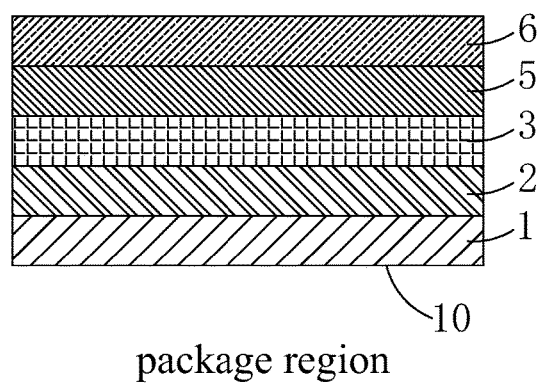

Please refer to FIG. 2. The present invention provides a package method of an OLED substrate, comprising steps of:

step 1, as shown in FIG. 3, providing a TFT substrate 10, and the TFT substrate 10 comprises a display region, and a package region at a periphery of the display region.

A structure of the TFT substrate 10 in the display region comprises a substrate 1, a gate metal layer 2 located on the substrate 1, a gate isolation layer 3 located on the gate metal layer 2 and substrate 1, a semiconductor layer 4 located on the gate isolation layer 3, an etching stopper layer 5 located on the semiconductor layer 4 and the gate isolation layer 3 and a source drain metal layer 6 located on the etching stopper layer 5, the semiconductor layer 4 and the gate isolation layer 3.

A structure of the TFT substrate 10 in the package region comprises a substrate 1, a gate metal layer 2 located on the substrate 1, a gate isolation layer 3 located on the gate metal layer 2, an etching stopper layer 5 located on the gate isolation layer 3 and a source drain metal layer 6 located on the etching stopper layer 5.

Figure 4:
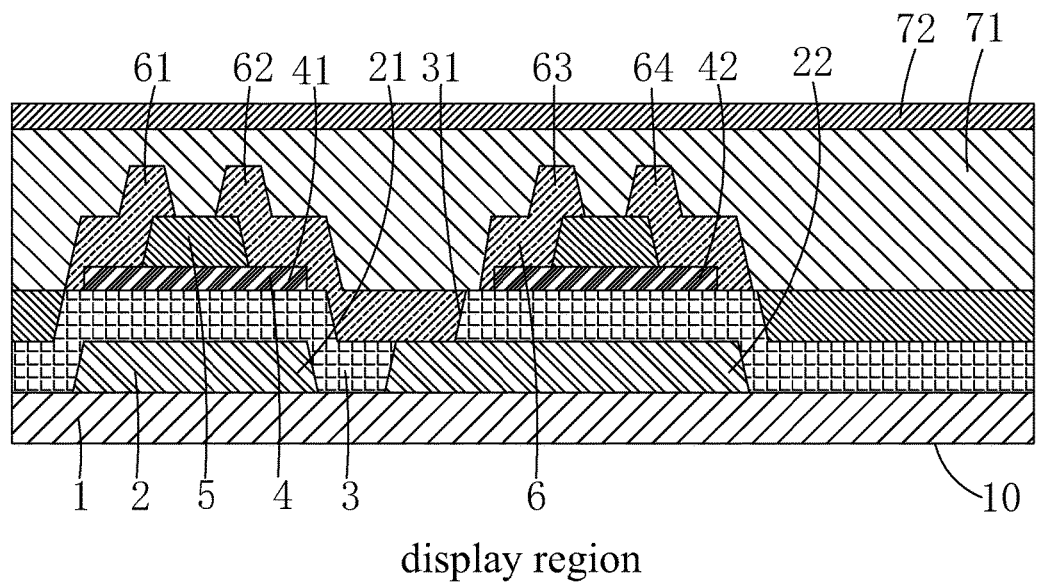
FIG. 4 is a diagram of the step 2 in the package method of the OLED substrate according to the present invention.
Figure 4:
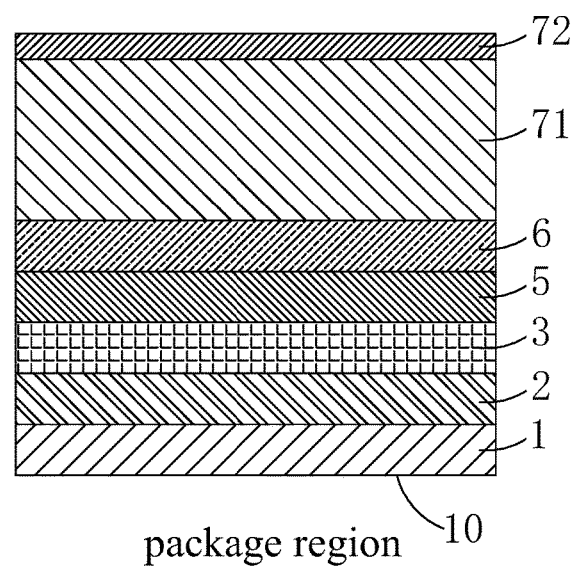

In the display region, the gate metal layer 2 comprises a first gate 21 and a second gate 22 which are located separately; the semiconductor layer 4 comprises a first semiconductor layer 41 and a second semiconductor layer 42 which are located separately; the source drain metal layer 6 comprises a first source 61, a first drain 62, a second source 63 and a second drain 64 which are located separately; the gate isolation layer 3 comprises a through hole 31, and the first drain 62 contacts with the first gate 21 through the through hole 31;

wherein the first gate 21, the first semiconductor layer 41, the first source 61 and the first drain 62 construct a Switching TFT; the second gate 22, the second semiconductor layer 42, the second source 63 and the second drain 64 construct a Driving TFT.

step 2, as shown in FIG. 4, sequentially forming a silicon oxide ($SiO_x$) layer 71 and a silicon oxynitride ($SiO_xN_y$) layer 72 on the display region and the package region of the TFT substrate 10, and the silicon oxide layer 71 and the silicon oxynitride layer 72 construct a passivation layer, together.

Specifically, both the silicon oxide layer 71 and the silicon oxynitride layer 72 are obtained by utilizing the chemical vapor deposition (CVD) method.

Specifically, a reaction formula of forming the silicon oxide layer 71 by utilizing chemical vapor deposition is: $SiH_4N_2O \rightarrow SiO_x$.

Specifically, a reaction formula of forming the silicon oxynitride layer 72 by utilizing chemical vapor deposition is: $SiH_4N_2O + N_2 \rightarrow SiO_xN_y$.

Specifically, a thickness of the silicon oxide layer 71 is 1500-4000 nm.

Figure 5:
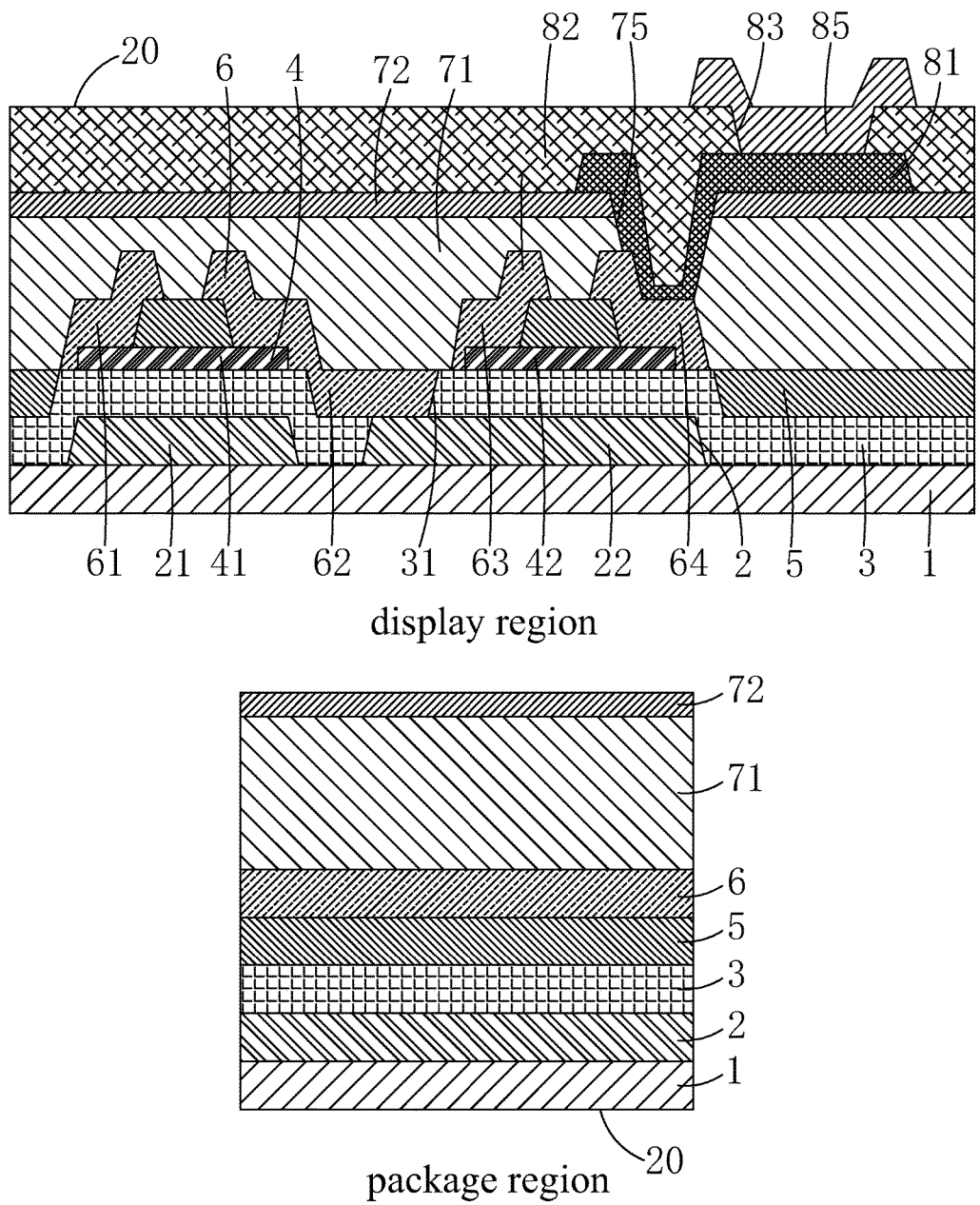
FIG. 5 is a structure diagram of the OLED substrate manufactured in the step 3 in the package method of the OLED substrate according to the present invention.

Specifically, a thickness of the silicon oxynitride layer 72 is 0-500 nm, and preferably to be 0-100 nm.

step 3, as shown in FIG. 5, sequentially manufacturing an anode 81, a pixel definition layer 82 and a light emitting layer 85 on the display region of the TFT substrate 10 to obtain an OLED substrate 20.

Specifically, the step 3 comprises steps of:

step 31, employing one photolithographic process to pattern the silicon oxide layer 71 and the silicon oxynitride layer 72 to obtain a first through hole 75 correspondingly above the second drain 64;

step 32, forming a conductive layer on the passivation layer 70, and employing one photolithographic process to pattern the conductive layer to obtain the anode 81, and the anode 81 contacts with the second drain 64 through the first through hole 75;

step 33, forming the pixel definition layer 82 on the anode 81 and the passivation layer 70, and employing one photolithographic process to pattern the pixel definition layer 82 to obtain a second through hole 83 correspondingly above the anode 81;

step 34, forming the light emitting layer 85 on the pixel definition layer 82, and the light emitting layer 85 contacts with the anode 81 through the second through hole 83.

Specifically, material of the pixel definition layer 82 is organic photoresist.

When the OLED substrate 20 is a bottom light emitting OLED substrate, the material of the anode 81 can be transparent conductive metal oxide substance such as ITO (Indium Tin Oxide); when the OLED substrate 20 is a top light emitting OLED substrate, the material of the anode 81 can be an Ag/ITO/Ag layers stacking structure.

Figure 6:
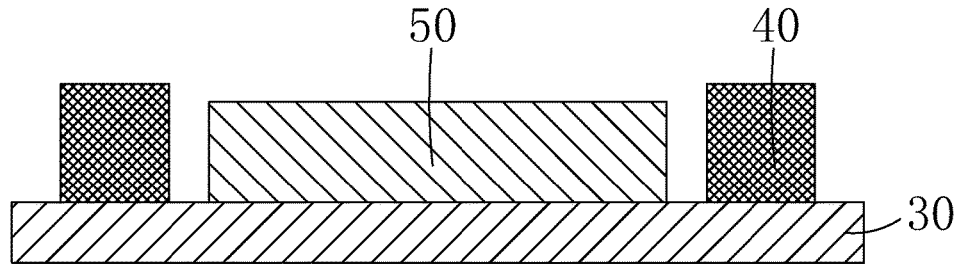
FIG. 6 is a diagram of the step 4 in the package method of the OLED substrate according to the present invention.

Specifically, in the step 34, evaporation or solution formation is utilized to manufacture the light emitting layer 85.

step 4, as shown in FIG. 6, providing a package cover plate 30, and coating seal 40 on the package cover plate 30 corresponding to a surface of the package region of the OLED substrate 20; forming a seal film 50 on the package cover plate 30 in a region inside the seal 40.

Specifically, material of the seal film 50 is polymer containing dryer or polymer capable of blocking water and vapor.

Specifically, the dryer can be inorganic substance, such as calcium oxide, sodium oxide, or polymer resin based organic substance which is water absorbent. The polymer material capable of blocking water and vapor can be sheet sealant.

Figure 7:
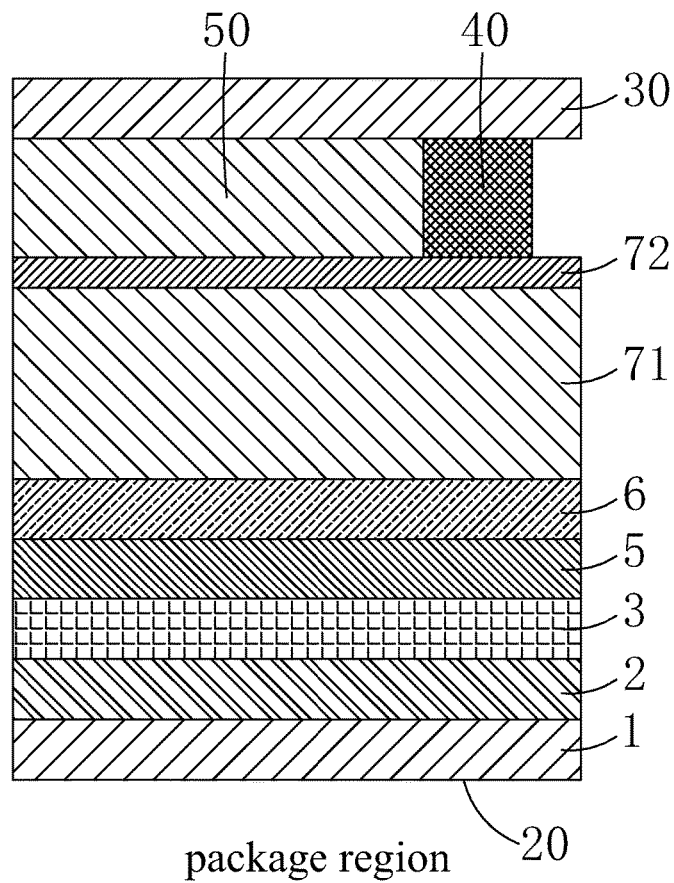
FIG. 7 is a diagram of the steps 5-6 in the package method of the OLED substrate according to the present invention.

Specifically, the package cover plate 30 is a glass substrate.

step 5, as shown in FIG. 7, oppositely laminating the OLED substrate 20 and the package cover plate 30.

step 6, solidifying the seal 40 to accomplish package of the package cover plate 30 to the OLED substrate 20.

Specifically, in the step 6, a method of ultraviolet light irradiation or heating is employed for solidifying the seal 40.

In the aforesaid package method of the OLED substrate, by manufacturing the passivation layer with two layers in the process of manufacturing the OLED substrate, and the first layer is a regular silicon oxide layer, and the second layer is a silicon oxynitride layer, in the package procedure, the silicon oxynitride layer directly contacts with the seal, and the adhesion of the seal and the silicon oxynitride layer is stronger to promote the adhesion result of the seal and the OLED substrate for achieving the result of the seal package performance.

Please refer to FIG. 7 and FIG. 5. The present invention further provides an OLED package structure, comprising an OLED substrate 20, a package cover plate 30 oppositely located to the OLED substrate 20 and seal 40 located between the OLED substrate 20 and the package cover plate 30;

the OLED substrate 20 comprises a display region and a package region at a periphery of the display region, and a surface layer of the package region of the OLED substrate 20 is a silicon oxynitride layer 72, and the seal 40 is located between the package region of the OLED substrate 20 and the package cover plate 30 to make the seal 40 contact with the silicon oxynitride layer 72. By utilizing the property of stronger adhesion of the seal 40 and the silicon oxynitride layer 72, the adhesion result of the seal 40 and the OLED substrate 20 is promoted.

As shown in FIG. 5, a structure of the OLED substrate 20 in the display region comprises a substrate 1, a gate metal layer 2 located on the substrate 1, a gate isolation layer 3 located on the gate metal layer 2 and substrate 1, a semiconductor layer 4 located on the gate isolation layer 3, an etching stopper layer 5 located on the semiconductor layer 4 and the gate isolation layer 3, a source drain metal layer 6 located on the etching stopper layer 5, the semiconductor layer 4 and the gate isolation layer 3, a silicon oxide layer 71 located on the source drain metal layer 6, the etching stopper layer 5 and the gate isolation layer 3, a silicon oxynitride layer 72 located on the silicon oxide layer 71, an anode 81 on the silicon oxynitride layer 72, a pixel definition layer 82 located on the anode 81 and the silicon oxynitride layer 72 and a light emitting layer 85 located on the pixel definition layer 82.

A structure of the OLED substrate 20 in the package region comprises a substrate 1, a gate metal layer 2 located on the substrate 1, a gate isolation layer 3 located on the gate metal layer 2, an etching stopper layer 5 located on the gate isolation layer 3 and a source drain metal layer 6 located on the etching stopper layer 5, a silicon oxide layer 71 located on the source drain metal layer 6 and a silicon oxynitride layer 72 located on the silicon oxide layer 71.

In the display region, the gate metal layer 2 comprises a first gate 21 and a second gate 22 which are located separately; the semiconductor layer 4 comprises a first semiconductor layer 41 and a second semiconductor layer 42 which are located separately; the source drain metal layer 6 comprises a first source 61, a first drain 62, a second source 63 and a second drain 64 which are located separately; the gate isolation layer 3 comprises a through hole 31, and the first drain 62 contacts with the first gate 21 through the through hole 31;

the first gate 21, the first semiconductor layer 41, the first source 61 and the first drain 62 construct a Switching TFT; the second gate 22, the second semiconductor layer 42, the second source 63 and the second drain 64 construct a Driving TFT.

The first through hole 75 is provided on the silicon oxide layer 71 and the silicon oxynitride layer 72 correspondingly above the second drain 64, and the anode 81 contacts with the second drain 64 through the first through hole 75, and the second through hole 83 is provided on the pixel definition layer 82 correspondingly above the anode 81, and the light emitting layer 85 contacts with the anode 81 through the second through hole 83.

Specifically, a thickness of the silicon oxide layer 71 is 1500-4000 nm; a thickness of the silicon oxynitride layer 72 is 0-500 nm, and preferably to be 0-100 nm. The silicon oxide layer 71 and the silicon oxynitride layer 72 construct a passivation layer, together.

Specifically, the package cover plate 30 is a glass substrate.

Specifically, the OLED substrate 20 further comprises a seal film 50 which is completely filled in an interior space between the OLED substrate 20 and the package cover plate 30 surrounded by seal 40.

Specifically, material of the seal film 50 is polymer containing dryer or polymer capable of blocking water and vapor.

Specifically, the dryer can be inorganic substance, such as calcium oxide, sodium oxide, or polymer resin based organic substance which is water absorbent. The polymer material capable of blocking water and vapor can be sheet sealant.

Specifically, material of the pixel definition layer 82 is organic photoresist.

When the OLED substrate 20 is a bottom light emitting OLED substrate, the material of the anode 81 can be transparent conductive metal oxide substance such as ITO (Indium Tin Oxide); when the OLED substrate 20 is a top light emitting OLED substrate, the material of the anode 81 can be an Ag/ITO/Ag layers stacking structure.

In conclusion, the present invention provides the package method of the OLED substrate. By manufacturing the passivation layer with two layers in the process of manufacturing the OLED substrate, and the first layer is a regular silicon oxide layer, and the second layer is a silicon oxynitride layer, in the package procedure, the silicon oxynitride layer directly contacts with the seal, and the adhesion of the seal and the silicon oxynitride layer is stronger to promote the adhesion result of the seal and the OLED substrate for achieving the result of the seal package performance. The present invention provides an OLED package structure. By arranging the surface layer of the package region of the OLED substrate to be the silicon oxynitride layer, the property of stronger adhesion of the seal and the silicon oxynitride layer is utilized to promote the adhesion result of the seal and the OLED substrate for achieving the result of the seal package performance.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A package method of an OLED substrate, comprising steps of:
    step 1, providing a TFT substrate, and the TFT substrate comprises a display region, and a package region at a periphery of the display region;
    step 2, sequentially forming a silicon oxide layer and a silicon oxynitride layer on the display region and the package region of the TFT substrate;
    step 3, sequentially manufacturing an anode, a pixel definition layer and a light emitting layer on the display region of the TFT substrate to obtain an OLED substrate;
    step 4, providing a package cover plate, and coating seal on the package cover plate corresponding to a surface of the package region of the OLED substrate;
    step 5, oppositely laminating the OLED substrate and the package cover plate;
    step 6, solidifying the seal to accomplish package of the package cover plate to the OLED substrate;
    wherein in the step 2, both the silicon oxide layer and the silicon oxynitride layer are obtained by utilizing chemical vapor deposition, and a reaction formula of forming the silicon oxide layer by utilizing chemical vapor deposition is: $SiH_4+N_2O \rightarrow SiO_x$; a reaction formula of forming the silicon oxynitride layer by utilizing chemical vapor deposition is: $SiH_4+N_2O+N_2 \rightarrow SiO_xN_y$.

2. The package method of the OLED substrate according to claim 1, wherein a structure of the TFT substrate in the display region comprises a substrate, a gate metal layer located on the substrate, a gate isolation layer located on the gate metal layer and substrate, a semiconductor layer located on the gate isolation layer, an etching stopper layer located on the semiconductor layer and the gate isolation layer and a source drain metal layer located on the etching stopper layer, the semiconductor layer and the gate isolation layer;

a structure of the TFT substrate in the package region comprises a substrate, a gate metal layer located on the substrate, a gate isolation layer located on the gate metal layer, an etching stopper layer located on the gate isolation layer and a source drain metal layer located on the etching stopper layer.

3. The package method of the OLED substrate according to claim 1, wherein a thickness of the silicon oxide layer is 1500-4000 nm; a thickness of the silicon oxynitride layer is less than or equal to 500 nm.

4. The package method of the OLED substrate according to claim 1, wherein the step 4 further comprises: forming a seal film on the package cover plate in a region inside the seal; the package cover plate is a glass substrate; material of the seal film is polymer containing dryer or polymer capable of blocking water and vapor; in the step 6, a method of ultraviolet light irradiation or heating is employed for solidifying the seal.

5. A package method of an OLED substrate, comprising steps of:

step 1, providing a TFT substrate, and the TFT substrate comprises a display region, and a package region at a periphery of the display region;

step 2, sequentially forming a silicon oxide layer and a silicon oxynitride layer on the display region and the package region of the TFT substrate;

step 3, sequentially manufacturing an anode, a pixel definition layer and a light emitting layer on the display region of the TFT substrate to obtain an OLED substrate;

step 4, providing a package cover plate, and coating seal on the package cover plate corresponding to a surface of the package region of the OLED substrate;

step 5, oppositely laminating the OLED substrate and the package cover plate;

step 6, solidifying the seal to accomplish package of the package cover plate to the OLED substrate;

wherein a structure of the TFT substrate in the display region comprises a substrate, a gate metal layer located on the substrate, a gate isolation layer located on the gate metal layer and substrate, a semiconductor layer located on the gate isolation layer, an etching stopper layer located on the semiconductor layer and the gate isolation layer and a source drain metal layer located on the etching stopper layer, the semiconductor layer and the gate isolation layer;

a structure of the TFT substrate in the package region comprises a substrate, a gate metal layer located on the substrate, a gate isolation layer located on the gate metal layer, an etching stopper layer located on the gate isolation layer and a source drain metal layer located on the etching stopper layer;

wherein in the step 2, both the silicon oxide layer and the silicon oxynitride layer are obtained by utilizing chemical vapor deposition, and a reaction formula of forming the silicon oxide layer by utilizing chemical vapor deposition is: $SiH_4+N_2O \rightarrow SiO_x$; a reaction formula of forming the silicon oxynitride layer by utilizing chemical vapor deposition is: $SiH_4+N_2O+N_2 \rightarrow SiO_xN_y$.

6. The package method of the OLED substrate according to claim 5, wherein a thickness of the silicon oxide layer is 1500-4000 nm; a thickness of the silicon oxynitride layer is less than or equal to 500 nm.

7. The package method of the OLED substrate according to claim 5, wherein the step 4 further comprises: forming a seal film on the package cover plate in a region inside the seal; the package cover plate is a glass substrate; material of the seal film is polymer containing dryer or polymer capable of blocking water and vapor; in the step 6, a method of ultraviolet light irradiation or heating is employed for solidifying the seal.

* * * * *